(12) United States Patent
Hazenberg et al.

(10) Patent No.: US 7,307,695 B2
(45) Date of Patent: Dec. 11, 2007

(54) METHOD AND DEVICE FOR ALIGNMENT OF A SUBSTRATE

(75) Inventors: Johannes Martinus Andreas Hazenberg, Veldhoven (NL); Patricius Aloysius Jacobus Tinnemans, Hapert (NL); Raimond Visser, Best (NL)

(73) Assignee: ASML Netherlands B.V., Veldhoven (NL)

( * ) Notice: Subject to any disclaimer, the term of this patent is extended or adjusted under 35 U.S.C. 154(b) by 179 days.

(21) Appl. No.: 10/960,786

(22) Filed: Oct. 8, 2004

(65) Prior Publication Data

US 2005/0140960 A1    Jun. 30, 2005

(30) Foreign Application Priority Data

Oct. 10, 2003    (EP)    ................... 03078206

(51) Int. Cl.
G03B 27/58    (2006.01)
G03B 27/54    (2006.01)

(52) U.S. Cl. ........................................... 355/72; 355/53

(58) Field of Classification Search ................. 355/53, 355/72–76; 414/245–247
See application file for complete search history.

(56) References Cited

U.S. PATENT DOCUMENTS 5,990,650 A    11/1999    Brock

| | | | |
|---|---|---|---|
| 6,188,467 B1 | 2/2001 | Yamatsu et al. | |
| 6,813,543 B2 * | 11/2004 | Aalund et al. | ............... 700/245 |
| 2002/0074635 A1 | 6/2002 | Hattori et al. | |

FOREIGN PATENT DOCUMENTS

EP    1 047 114 A2    10/2000

* cited by examiner

*Primary Examiner*—Henry Hung Nguyen
(74) *Attorney, Agent, or Firm*—Pillsbury Winthrop Shaw Pittman LLP

(57) ABSTRACT

Embodiments of the invention include a method of placing a substrate on a support. In an embodiment of the invention, the method includes determining a position of the substrate relative to a reference position via a sensor which outputs a sensor signal to a control unit, the determining including detecting the position of the substrate in a chamber, and determining a gripping position on the substrate; gripping the substrate at the gripping position with a gripper controlled by the control unit, and providing the substrate in a defined position on the support member, the providing including moving the substrate to a fixed position relative to the support member such that the center of the substrate arrives at a predetermined position on the support member.

23 Claims, 4 Drawing Sheets

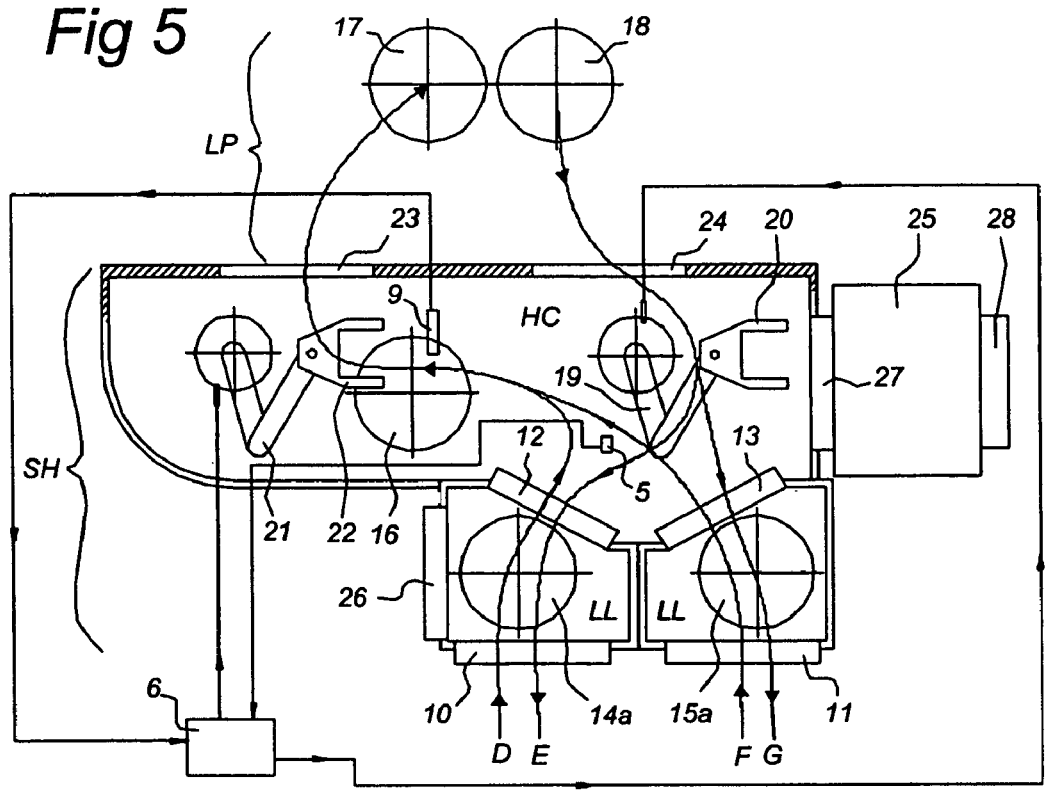
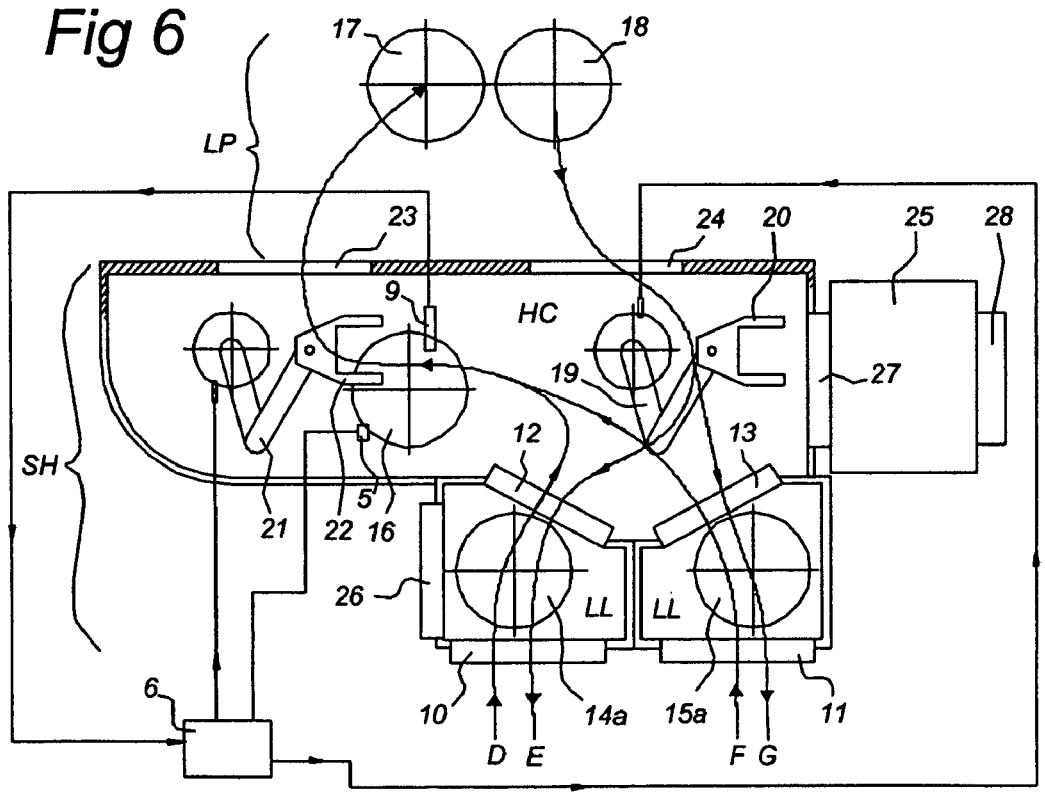

METHOD AND DEVICE FOR ALIGNMENT OF A SUBSTRATE

PRIORITY INFORMATION

This application claims priority from European Patent Application No. 03078206.04, filed Oct. 10, 2003, the content of which is herein incorporated by reference in its entirety.

BACKGROUND

1. Field of the Invention

The invention relates to lithographic apparatus and methods.

2. Description of Related Art

A lithographic apparatus typically includes a radiation system configured to condition a beam of radiation, a support structure configured to support a patterning device, the patterning device serving to pattern the beam of radiation according to a desired pattern, a substrate table configured to hold a substrate, and a projection system configured to project the patterned beam onto a target portion of the substrate.

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below).

Examples of such patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described above, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as above set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure or a variant thereof, will have to be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co;, 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In a typical lithography arrangement, substrates are transported to the substrate stage of a lithographic projection apparatus via a substrate track and a substrate handler. In the substrate track the surface of the substrate is pre-treated. The pre-treatment of the substrate typically includes at least partially covering the substrate by a layer of radiation-sensitive material (resist). Further, prior to the imaging step, the substrate may undergo various other pre-treatment procedures, such as priming, and soft bake. After the pre-treatment of the substrate the substrate is transported from the substrate track to the substrate stage via the substrate handler.

The substrate handler typically is adapted to accurately position the substrate on the substrate table of the substrate stage and may also control the temperature of the substrate.

For a certain lithographic projection apparatus, such as an apparatus using Extreme Ultra-Violet radiation (in short EUV-radiation), it is desirable that the projection onto a substrate be operated under vacuum. Therefore the substrate handler should be adapted to transfer the pre-treated substrate into a vacuum. That typically means that at least after the pre-treatment of the substrate in the substrate track, the handling and the temperature control of the substrate should be accomplished in a vacuum.

For another type of lithographic projection apparatus, such as an apparatus operated in a $N_2$ environment using 157 nm radiation, it is desirable that a specific gas environment, such as a $N_2$ environment, is maintained. Therefore the substrate handler should be adapted to transfer the pre-treated substrate into a specific gas environment. That typically means that at least after the pre-treatment of the substrate in the substrate track, the handling and the temperature control of the substrate should be accomplished in a specific gas environment.

A wafer handling apparatus adapted to carry out wafer positioning in a vacuum load lock is known from GB-A-2 349 204.

This publication discloses a wafer processing apparatus, such as an ion implantation apparatus, in which a wafer is loaded into a vacuum chamber through a load lock. In the load lock, a number of sensors are arranged to determine the position of the wafer through edge detection. The wafer is gripped by a gripper arm in the vacuum chamber. The gripper arm servo drives are computer controlled, and sensor signal readings are taken and compared by the computer with stored readings to determine if the gripper and wafer are properly positioned.

With conventional apparatus, however, positioning via the gripper arm may lead to mechanical inaccuracies in offset in the range of 100 micrometers or more. For lithographic purposes, in which the pattern on the substrate should be accurately aligned on the substrate stage with accuracies of several micrometers or less, the known gripper arms may not be suitable.

Accordingly, it would be advantageous to provide a method and apparatus for placing a substrate on a support member in which the number of substrate transfers is minimized and in which the substrate can be accurately aligned with respect to the support member.

It would also be advantageous to provide a method and apparatus for placing a substrate on a support member in a vacuum chamber, in particular in a EUV-lithography apparatus.

SUMMARY

Embodiments of the invention include a method of placing a substrate on a support member. In an embodiment of the invention, the method includes determining a position of the substrate relative to a reference position via a sensor which outputs a sensor signal to a control unit, and gripping the substrate with a gripper controlled by the control unit and providing the substrate in a defined position on the support member, wherein the method further includes detecting the position of the substrate in a chamber, determining a gripping position on the substrate gripping the substrate using the gripper at the gripping position and moving the substrate to a fixed position relative to the support member, such that the centre of the substrate arrives at a predetermined position on the support member, or gripping the substrate using the gripper at a fixed gripping position relative to the chamber, detecting the position of the gripped substrate using the sensor and moving the substrate to a varying position relative to the support member, such that the centre of the substrate arrives at a predetermined position on the support member.

A position of the substrate may be determined when the substrate is in the chamber, prior to being gripped by the gripper, or after being gripped by the gripper and while being transferred to the support. The gripper position is controlled, on the basis of the sensor signal, to correct an offset of the substrate centre relative to the support, at the position of gripping of the substrate or at the position of providing of the substrate to the support. In this manner an accurate positioning of the substrate on the support can be achieved with an accuracy of several micrometers or less.

In one embodiment of the invention, the chamber is a reduced pressure transfer device, and the method further includes placing the substrate in the transfer device and evacuating the transfer device.

In a vacuum environment, such as for instance in EUV-lithography apparatus, the method according to an embodiment of the present invention reduces the number of take-overs of the substrate when it is transferred to a support. The manipulator movements to transfer the substrate from the load lock into the vacuum chamber are used to correctly position the substrate, either by an offset in the gripping position, or by an offset in position when providing the substrate to a support (pre-alignment support). A separate centering chuck in the chamber, such as commonly used in conventional lithographic projection apparatus, can be omitted in this way, and transfer from such a centering chuck to the (pre-alignment) support is avoided. This results in a reduced number of transfers, reduced transfer times and reduced substrate contamination.

Furthermore, the reduction of the number of mechanical components results in reduced prices and a reduced number of components of the vacuum system.

In one embodiment of the invention, the sensor is provided in the transfer device, such as a load lock. In the transfer device the substrate is stationary, such that a position reading can be obtained in a relatively simple and accurate manner. Upon gripping by the gripper, sufficient time is available for carrying out the positional measurement and performing a positional correction.

In a further embodiment of the invention, the sensor is provided between the transfer device and the support member, the method including moving the substrate relative to gripper, the sensor calculating on the basis of a sensor signal from the sensor a position of the substrate, and directing the gripper to the fixed or varying position.

By placing the sensor outside the transfer device, the centering can be carried out not only for substrates coming from the transfer device, but also for substrates coming from other positions, such as from a further transfer device or from the substrate stage. The position of the sensor is such that the movement of the gripper at the position of the sensor is substantially the same for positioning a substrate going from the load lock to the (pre-alignment) support and for substrates being transferred from another position (substrate stage or further load lock) onto the (pre-alignment) support.

As space in a load lock is limited, the sensor is advantageously placed outside of the load lock. Measuring the position of the substrate "in the flight" furthermore results in a reduced time for determining the position of the substrate.

In an embodiment of the invention in which the sensor is placed outside the transfer device, the front and rear edge of the substrate can be detected when passing over the sensor. In this way, the number of readings per sensor can be doubled and the accuracy may be improved.

In a further embodiment of the invention, the sensor is placed in proximity to the (pre-alignment) support. In this case substrates can be placed onto the (pre-alignment) support by a further gripper which does not interface with a load lock. Also, the centering correction can be carried out simultaneously with the movement of the substrate towards the (pre-alignment) support (z-direction). This results in a faster centering using less steps, resulting in reduced contamination (dirt, temperature, etc.).

A method in accordance with an embodiment of the invention includes rotating the support surface of the member with the substrate thereon and detecting a number of edge positions of the substrate with a sensor, picking the substrate from the support member using the gripper and returning the substrate with its centre and its angular orientation in a defined position on the support member.

In this manner, an edge detection sensor can be used for centering of a substrate in x and y directions on the (pre-alignment) support. The rotational position, Rz, of the substrate cannot be aligned but can be measured and the support can be rotated to compensate for this. This could form a rapid way of centering the substrate.

BRIEF DESCRIPTION OF THE DRAWINGS

Embodiments of the invention will now be described, by way of example only, with reference to the accompanying schematic drawings in which corresponding reference symbols or numbers indicate corresponding parts, and in which:

FIG. 5 depicts a lithographic projection assembly according to another embodiment of the invention wherein the sensor is placed in the handling chamber;

FIG. 6 depicts a lithographic projection assembly according to an embodiment of the invention wherein the sensor is placed in close proximity to the pre-alignment support;

DETAILED DESCRIPTION

Figure 1:
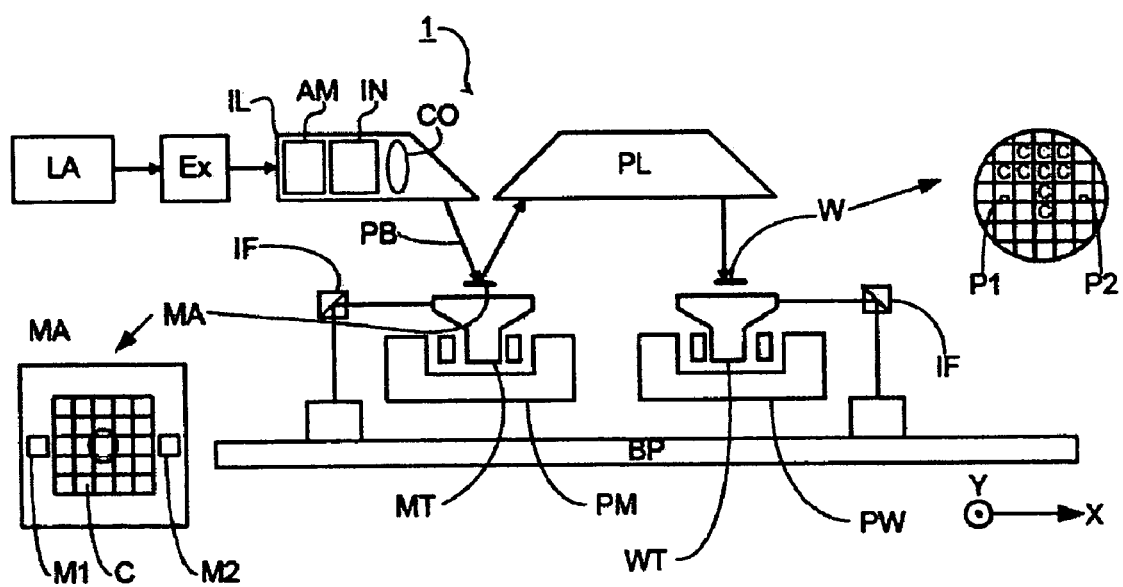
FIG. 1 schematically depicts a lithographic projection apparatus according to an embodiment of the invention.

FIG. 1 schematically depicts a lithographic projection apparatus 1 (LP) according to an embodiment of the invention. The apparatus includes a radiation system Ex, IL, configured to condition a beam PB of radiation (e.g. EUV radiation). In this particular case, the radiation system also includes a radiation source LA. The apparatus also includes a first object table (mask table) MT provided with a mask holder configured to hold a mask MA (e.g. a reticle), and connected to a first positioning device PM configured to accurately position the mask with respect to item PL. The apparatus also includes a second object table (substrate table) WT provided with a substrate holder configured to hold a substrate W (e.g. a resist-coated silicon wafer), and connected to a second positioning device PW configured to accurately position the substrate with respect to item PL ("lens"). The apparatus further includes a projection system ("lens") PL (e.g. a reflective mirror system) configured to image an irradiated portion of the mask MA onto a target portion C (e.g. including one or more dies) of the substrate W.

As here depicted, the apparatus is of a reflective type (i.e. has a reflective mask). However, in general, it may also be of a transmissive type, for example (with a transmissive mask with a refractive lens system). Alternatively, the apparatus may employ another kind of patterning device, such as a programmable mirror array of a type as referred to above.

The source LA (e.g. a plasma source) produces a beam of radiation. This beam is fed into an illumination system (illuminator) IL, either directly or after having traversed conditioning devices, such as a beam expander Ex, for example. The illuminator IL may include adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Being reflected by the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

Step mode: the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and Scan mode: essentially the same scenario applies, except that a given target portion C is not exposed in a single "flash". Instead, the mask table MT is movable in a given direction (the so-called "scan direction", e.g. the y direction) with a speed v, so that the beam PB is caused to scan over a mask image; concurrently, the substrate table WT is simultaneously moved in the same or opposite direction at a speed $V=Mv$, in which M is the magnification of the lens PL (typically, $M=\frac{1}{4}$ or $\frac{1}{5}$). In this manner, a relatively large target portion C can be exposed, without having to compromise on resolution.

Figure 2:
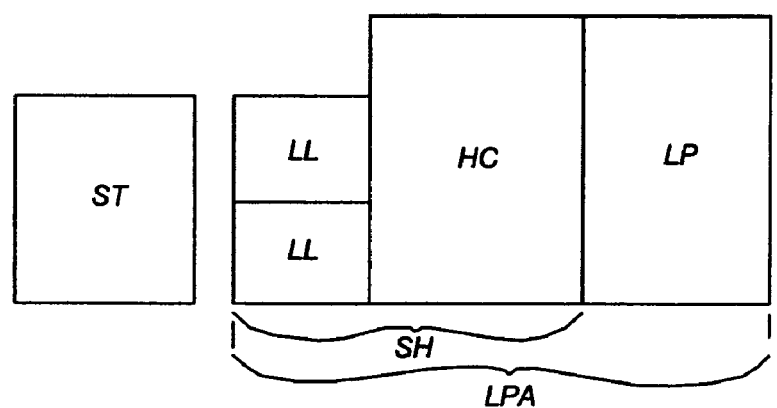
FIG. 2 schematically depicts the general layout of the separate modules of a lithographic projection assembly according to an embodiment of the invention.

FIG. 2 schematically depicts the layout of the separate modules of a lithographic projection assembly LPA according to an embodiment of the invention. The layout includes two load locks LL configured to transfer substrates between a first environment and a second environment. The second environment, prevailing in the modules HC and LP, has a lower pressure than the first environment. The layout also includes a handler chamber HC that is provided with pre-processing devices, such as a pre-alignment support and/or thermal treatment device, which are configured to pre-process the substrates and transport devices configured to transfer substrates from the load locks LL to the pre-processing devices and further from the pre-processing devices to a load position in the lithographic projection apparatus LP and in reverse direction from an unload position in the lithographic projection apparatus LP to the load locks LL. The layout further includes a lithographic projection apparatus LP, as described in more detail above.

The load locks together with the handler chamber are commonly designated as substrate handler SH.

The lithographic projection apparatus includes a projection chamber, which comprises, inter alia, a substrate table WT and typically the second positioning device PW from FIG. 1 and evacuating devices configured to evacuate the projection chamber. The functioning of the load locks and handler chamber are described in more detail below.

Figure 3:
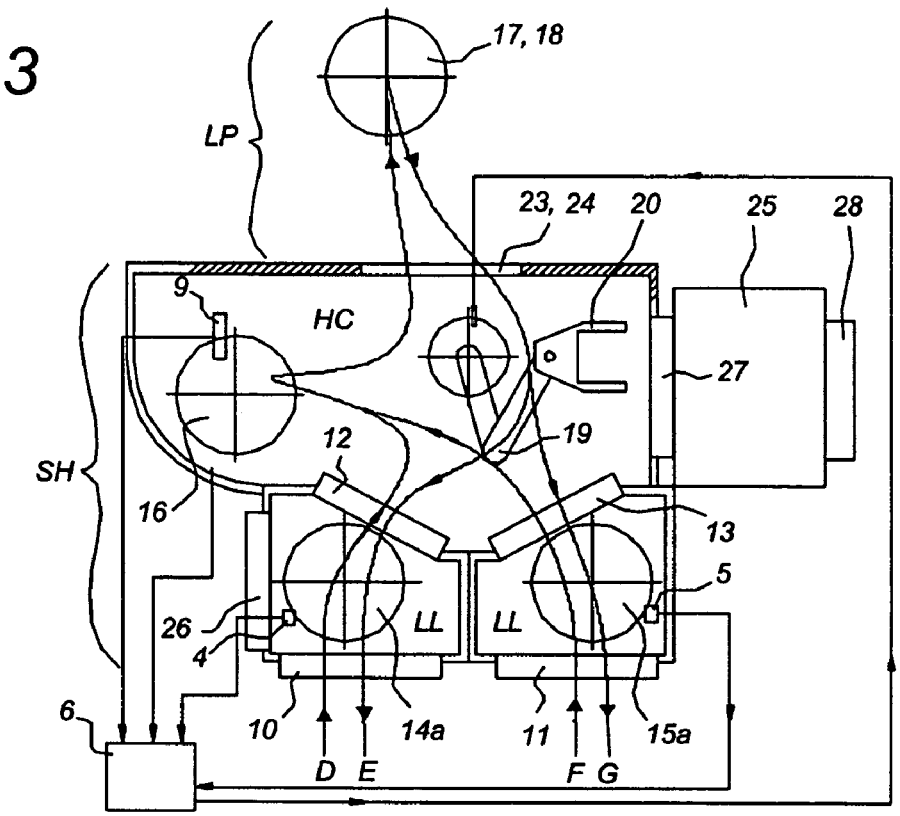
FIGS. 3 and 4 depict a lithographic projection assembly according to a first and a second embodiment of the invention wherein the sensor is placed inside the load locks.
Figure 4:
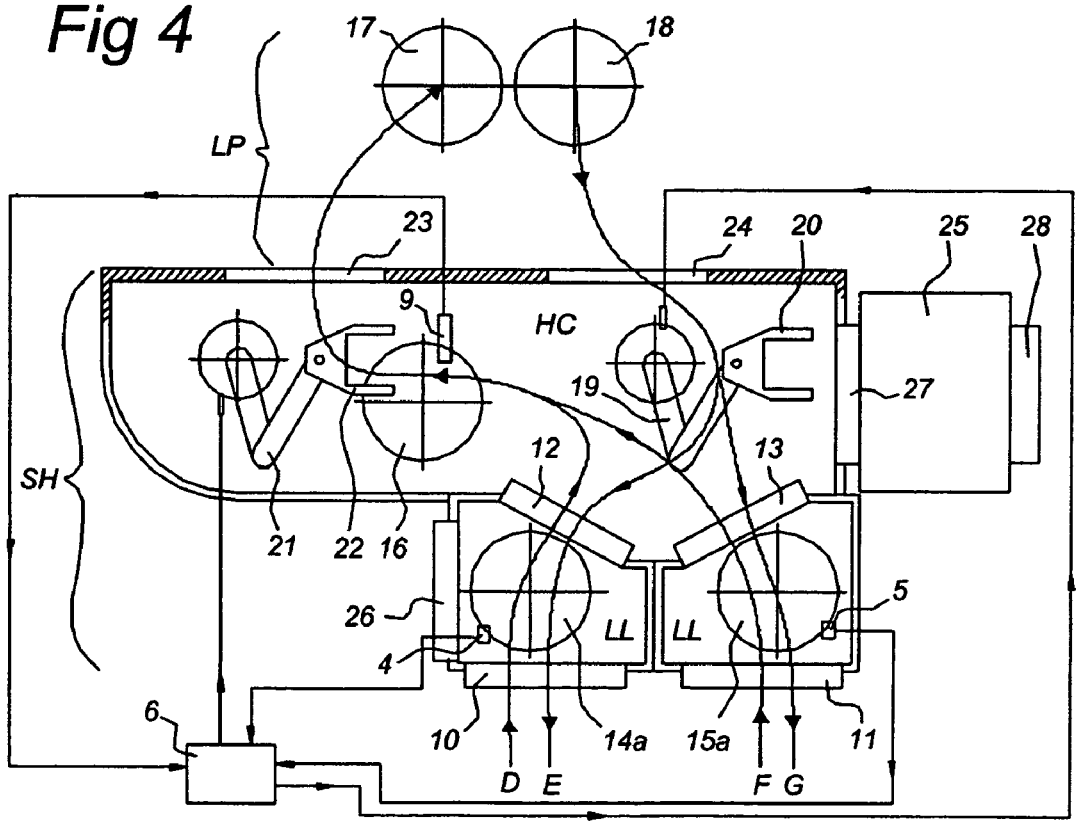

FIG. 3 and FIG. 4 depict a lithographic projection assembly according to a first and a second embodiment, respectively, of the invention. In both Figures, the following modules will be recognized: two load locks LL; the handler chamber HC, in combination with two load locks LL designated as a substrate handler SH; and the lithographic projection apparatus LP, including a projection chamber.

In the latter module LP, the arrangement is not shown in detail but can be understood by example from FIG. 1.

Adjacent to the load locks LL opposite to the handler chamber HC another module may be present such as a substrate track ST (see FIG. 2), that is configured to supply and remove substrates to and from the load locks LL.

In each load lock LL, a door 10, 11 is present, which door is configured to allow transfer of substrates between the first environment and the load lock LL. At the opposite side thereof, each load lock is provided with a door 12, 13 that are configured to allow transfer of substrates between the load lock LL and the handler chamber HC. The second environment will prevail in the handler chamber HC and the lithographic projection apparatus LP during the projection process. Each door 10, 11, 12, 13 is equipped to close off the interior of the respective load lock in a gas-tight manner.

Each load lock has a substrate support position 14a, 15a to support a substrate.

The second environment can have a lower pressure than the first environment. When the lithographic projection apparatus LP uses extreme ultra-violet (EUV) radiation, for example, the second environment may be a vacuum environment. The projection chamber in this case is a vacuum chamber. To establish a vacuum atmosphere, the lithographic projection assembly of both embodiments may be provided with a vacuum device that is configured to establish or maintain a vacuum (not shown).

Alternatively, the second environment can also be a special gas environment, such as a nitrogen environment.

In order to transfer substrates between the first environment and a second environment, with lower pressure, without damaging vital parts due to uncontrolled fierce air flow, just one door of a load lock LL may be opened at a time. Upon transferring from the substrate support position 14a, 15a to the first environment, the load lock LL may be vented first before opening the respective door 10, 11, while upon transferring from the substrate support position 14a, 15a to the second environment the load lock may first be pumped to the required vacuum level before opening the respective door 12, 13.

In the handler chamber HC, a pre-processing position 16 is present, where pre-alignment devices and/or thermal treatment devices may be disposed (not shown). Pre-alignment at the pre-processing position 16 is desirable in order to reach a required level of accuracy in positioning of the substrate on substrate wafer table WT. A next position is the load position 17 in the lithographic projection apparatus LP. At this position the substrate is placed on the substrate table WT from FIG. 1. Applying a thermal treatment at this position 16 may be advantageous in order to maintain a controlled temperature across the substrate, before introduction of the substrate into the lithographic projection apparatus LP.

In the second embodiment of the invention depicted in FIG. 4, an additional unload position 18 is disposed in the lithographic projection apparatus LP. This in contrast to the first embodiment of FIG. 3 in which both positions 17 and 18 coincide.

Upon transferring substrates between the handler chamber HC and the lithographic projection apparatus LP and vice versa, a substrate passes an entrance 23 or 24. Comparable with the difference in the previous paragraph, in the first embodiment of FIG. 3 the entrance between the handler chamber and load and unload position 23, 24 coincide.

Another difference between the first and second embodiment of FIG. 3 and FIG. 4 relates to the transport devices. The first embodiment of FIG. 3 includes one manipulator 19 having a gripper 20, while the second embodiment depicted in FIG. 4 includes next to the first manipulator a second manipulator, also having a gripper 22. Both manipulators are in these embodiments a robot, a SCARA robot, but also other robots or other manipulators are conceivable.

The robots are adapted for the following operations:
1. picking a substrate from one of the load locks LL and transferring the substrate to the pre-processing position 16; and/or
2. picking a substrate from the pre-processing position 16 and transferring the substrate to the load position 17; and/or
3. picking a substrate from the unload position 18 and transferring the substrate to the substrate support position 14, 15 of one of the load locks LL.

Enhanced throughput of substrates in the first embodiment can be reached by combining two or more of the three operations mentioned above before either venting or pumping down one of the load locks LL.

It will be appreciated that the operations mentioned above may be drastically enhanced upon using two robots instead of one robot, as is the case in the second embodiment.

It will also be appreciated that other advantageous combinations may be possible in other embodiments of the invention.

The most logical sequence of transfer operations may depend on the mode of operation of the lithographic projection assembly LPA;
- start-up phase, in which no transfer of a substrate from the unload position 18 to load lock LL may be necessary and one or more substrates are transferred into the handler chamber and the lithographic projection apparatus;
- steady state operation in which there is even transfer to and from the load position 17 and unload position 18 respectively; or
- run empty phase, in which no transfer from a load lock LL to the pre-processing position 16 or to a load position occurs and one or more substrates are transferred out of the handler chamber and the lithographic projection apparatus.

According to an embodiment of the invention, each load lock LL is provided with a first 14a, 15a and a second substrate support position 14b, 15b (not shown in FIG. 3 and 4. An additional support position may enhance the possibilities to combine the mentioned three transfer operations, because the second position can act as a buffer for incoming and outgoing substrates.

In both the first and second embodiments, the load locks together with the corresponding robots both are formed as a so-called two-way load lock, meaning that each load lock is accessible by both a robot(s) in the handler chamber and a robot(s) from, e.g. the substrate track, in such a way that substrates can be transferred past the doors 10, 11, 12, 13 in both directions. This is indicated by lines D, E, F, G provided with arrow heads in FIGS. 3 and 4. This configuration can enhance the throughput of substrates. A lithographic projection assembly according to an embodiment of the invention, where one load lock is for incoming substrates and the other load lock for outgoing substrates are also feasible. Such an embodiment reduces the flexibility for combination of the three transfer operations, but at the same time reduces the requirements with respect to the operational reach of the robots.

In both embodiments, the substrate handler SH is optionally provided with a third load lock 25 for transferring substrates between a third environment and the second environment. On opposite sides of the third load lock 25 two doors 27, 28 are provided. Door 27 connects the interior of the third load lock to the handler chamber. External door 28 connects the interior of the third load lock to the environment exterior to the substrate handler.

This third load lock is disposed at a side of the handler chamber that is freely accessible and it enhances the flexibility and application possibilities of the lithographic projection assembly LPA, e.g. by using this third load lock as a buffer in case a substrate should be removed or in case both substrate support positions of the first and second load lock 14a, 15a are already taken. Furthermore it can be used to facilitate repair and maintenance of the handler chamber HC and/or the lithographic projection apparatus LP. It is noted that the third environment can be the same as the first environment, but can also be different from the first environment.

In FIGS. 3 and 4, one of the load locks LL includes an optional external door 26 that is disposed at a side that is freely accessible. This door 26 is configured to transfer substrates or other objects directly from a third environment (which can be the same as the first environment) to the load lock. Furthermore, it can be used for repair and maintenance of the corresponding load lock. It is also possible to provide both load locks with an external door 26 or to dispose the external door 26 at the other load lock LL.

In the embodiment of the invention represented in FIGS. 3 and 4, a sensor 4, 5 may be placed in the load locks LL. The sensor 4, 5 may be an optical sensor, such as a CCD-camera, or may be an electrostatic, a magnetic or a mechanical sensor. The sensor 4, 5 determines the position of a substrate 1 in the load lock LL and provides data used to control the manipulator(s) 19, 21 to provide the substrate 1 with its centre to a pre-determined position of the pre-processing position 16.

When the sensor 4,5 or sensor 9 described hereafter includes a video camera which views and measures the position of the substrate and of the manipulators 19, 20, a positioning may be obtained which is independent of a notch position on the substrate edge. The video camera signal is used in a control unit 6 in the servo loop of the manipulators 19, 20 for providing a feedback signal in the position control program of the manipulators 19, 20 which are controlled by unit 6. A video detecting system can be used without the need for calibration.

On the pre-processing position 16, the substrate is properly placed with its centre is in the required position. When the pre-processing position 16 includes a pre-alignment device, the substrate can be and is given an angular orientation by rotating a support of the pre-alignment device around its centre, such that the substrate can be transferred with the proper orientation to a substrate table in a load position 17. Positioning of the substrate at the pre-alignment support 16 may be carried out in two ways:

In a first way of positioning, the sensor signals of sensors 4, 5 determine the position of the centre of the substrate 1 at the substrate support position 14a, 15a in the load lock LL, with respect to the pre-alignment support 16. Next, the gripper 20, 21 grips the substrate to the load lock LL at a fixed picking position. The manipulator 19, 21 with the substrate is directed by the control unit 6 to a varying position near the pre-alignment support 16, such that the centre of the wafer 1 is placed proximate the centre of the pre-alignment support, and provides the substrate 1 to the pre-alignment support.

A second sensor 9 may be used near the pre-alignment support 16 to detect an edge contour of the substrate as the substrate is rotated by a rotating pre-alignment support 16. The edge contour may be calculated in the control unit 6. On the basis of the edge contour, the angular orientation of the substrate on the pre-alignment support 16 may be determined.

In a second way of positioning, the position of the substrate 1 may be determined by the control unit 6 on the basis of the sensor signals, relative to the pre-alignment support 16. The manipulator 19, 21 is next controlled such that the gripper picks the substrate from the support position 14a, 15a in the load lock LL in a calculated gripping position. Next, the manipulator 19,21 is directed by the control unit 6 to a fixed position near the pre-alignment support, such that the centre of the substrate, due to the calculated gripping position of the substrate, is located proximate the centre of the pre-alignment support 16. The substrate is then provided to the pre-alignment support.

In the embodiment of the invention shown in FIGS. 3 and 4, the sensors 4, 5 are placed inside the load lock LL. In the load lock LL, the substrate 1 may be stationary on the substrate support position 14a, 15a, such that a positional reading can be obtained in a relatively simple and accurate manner. Prior to picking up a substrate with the gripper from the load lock LL, sufficient time is available for carrying out the positional measurement—for instance while the load lock LL is evacuated—and performing positional determinations as described above.

In the embodiment shown in FIG. 5, the sensor 5 is placed within the handler chamber HC, such that the substrates, while being loaded or unloaded, pass over or under the sensor. In the position of the sensor 5 shown in FIG. 5, the centering of the substrate can be carried out not only for substrates coming from the load lock LL, but also for substrates coming from other positions, such as from the third load lock 25. The position of the sensor 5 is such that the movement of the manipulators 19, 21 at the position of the sensor is substantially the same for positioning a substrate going from the load locks LL to the pre-processing position 16 and for substrates being transferred from the further load lock 25 onto the pre-processing position 16.

The sensor 5 measures the position of the substrate "in the flight", i.e. when it passes the sensor 5, resulting in a reduced time for determining the position of the substrate. In the control unit 6, the position of the substrate may be determined by edge detection techniques, by determining the edge contour of the substrate, or by detecting the leading and the trailing edge of the substrate when passing the sensor 5. In this way, the number of readings per sensor can be doubled and the accuracy may be improved. Other ways of detecting the substrate position with the aid of the sensor 5 can be done by using one or more marks on the substrate.

In the embodiment of the invention shown in FIG. 6, the sensor 5 is located in close proximity to the pre-processing position 16. In this case, the sensor position may be insensitive to the path of the manipulators within the handling chamber HC, and substrates can be provided with equal accuracy to the pre-processing position 16 by both manipulators 19, 21, for substrates coming from load locks LL and from the third load lock 25. Also, the centering correction of the substrate provided to the pre-processing position 16 can be carried out simultaneously with a vertical movement of the substrate towards the pre-processing position(z-direction).

In the embodiments of the invention represented in FIGS. 4-6, the sensor 9 may be used for carrying out the angular orientation step of substrates at the pre-processing position 16, for example, by providing edge or marker detection from which edge/mark detection data can be used to control rotation of a pre-alignment support at position 16. It is also possible to have a fine positioning step carried out on the basis of the signals of the sensor 9, which signals can be used by the control unit 6 to control the manipulator 19, 21 to pick the substrate from the pre-alignment support 16 and to provide it at a corrected position.

The control unit 6 may carry out a Fast Fourier Transform (FFT) of the sensor signals of sensors 4, 5 and/or 9 in FIGS. 4-6. As is illustrated in FIG. 7, the edge of a non-round substrate $R_{edge,wafer}(\phi_{wafer})$, in terms of substrate polar coordinates, is given in an exact description by:

$$R_{edge,wafer}(\varphi_{wafer}) = A_0 + \sum_{m=2}^{\infty} A_m \cos(m \cdot \varphi_{wafer} + \varphi_{offset,wafer}(m)).$$

Figure 7:
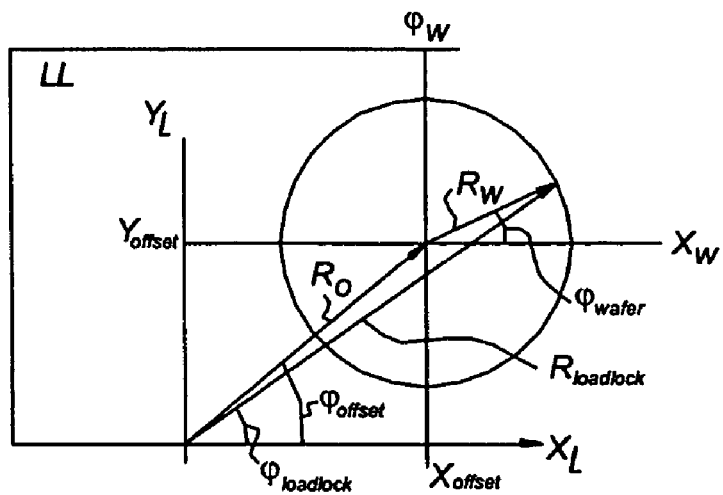
FIG. 7 shows a schematic view of a substrate placed in the load lock and the substrate edge as a function of the substrate coordinates and the load lock coordinates.

Wherein, $\phi_{wafer}$ is the angle of the radius $R_w$ in the substrate coordinate system, as indicated in FIG. 7, $\phi_{offset,wafer}$ is the angle of the radius $R_o$ between the center of the load lock (or substrate stage) coordinate system and the substrate center, m is the index for the unroundness of the substrate, in which the term $A_0$ at m=0 indicates the radius of the wafer (100 mm or 150 mm typically), m=1 indicates the offset here taken o, m=2 indicates the ellipticity etc. In the equation above, the offset (m=1) term has been omitted since the substrate edge is given as a function of the substrate coordinates.

In terms of the load lock coordinates, the edge of an unround substrate $R_{edge,loadlock}(\phi_{loadlock})$ can be described as a function of the load lock coordinates as:

$$R_{edge,loadlock}(\varphi_{loadlock}) = \sqrt{\begin{array}{l}(R_{edge,wafer}\cos(\varphi_{wafer}) + x_{offset})^2 + \\ (R_{edge,wafer}\sin(\varphi_{wafer}) + y_{offset})^2\end{array}}$$

$$\tan(\varphi_{loadlock}) = \frac{R_{edge,wafer}\sin(\varphi_{wafer}) + y_{offet}}{R_{edge,wafer}\cos(\varphi_{wafer}) + x_{offset}} \text{ or solved}$$

$$\varphi_{wafer} = -\arcsin\left(\left(\frac{y_{offset} + x_{offset}\tan(\varphi_{loadlock})}{R_{edge,wafer}}\right)\cos(\varphi_{loadlock})\right) - \varphi_{loadlock}$$

Herein φ load lock is the angle of radius $R_{edge}$, load lock in the load lock coordinate system, as shown in FIG. 7. $x_{offset}$ and $y_{offset}$ are the coordinates of the wafer center in the load lock coordinate system.

Because $A_0 \gg y_{offset}$ and $A_0 \gg x_{offset}$, it follows that $\phi_{wafer} \approx \phi_{loadlock}$. Therefore, the edge of a non-round substrate can be described in approximation as a function of the load lock coordinates as:

$$R_{edge,loadloack}(\varphi_{loadlock}) = A_0 + x_{offset}\cos(\varphi_{loadlock}) +$$

$$y_{offset}\sin(\varphi_{loadlock}) + \sum_{m=2}^{\infty} A_m \cos(m \cdot \varphi_{loadlock} + \varphi_{offset,wafer}(m)).$$

Herein $A_0$ is the radius of the substrate, $x_{offset} \cos(\phi_{loadlock}) + y_{offset} \sin(\phi_{loadlock})$ is the substrate centering on the load lock, and $$\sum_{m=2}^{\infty} A_m \cos(m \cdot \varphi_{loadlock} + \varphi_{offset,wafer}(m))$$

is a disturbance factor.

For determining the offset of the substrate, or the centering, the centering term can be found by a Fast Fourier Transform of the sensor readings of sensors 4 or 9 of $R_{edge,loadloack}(\phi_{loadlock})$. In the Fourier series, only a single frequency component needs to be calculated. The phase and absolute value of the first frequency component thus found represent the polar coordinates of the substrate eccentricity. The main steps in the FFT algorithm are:

Function[x_offset_measured, y_offset_measured]=fourier_algorithm(R_serie, N)
% determine offset by a fourier transform;
% the length of R is L=N(measuring points)*S(number of samples)
% note that the measuring positions must have an EQUIDISTANT distribution
L=length(R_serie);
S=L/N;
k=S+1;
G=0;
for i=1:L
G=G+(R_serie(i)*exp(j*2*pi*(1−k)*(i−1)/L));
end
X_offset_measured=2*abs(G)*cos(angle(G))/L;
% measured x_offset of the wafer
Y_offset_measured=2*abs(G)*sin(angle(G))/L;
% measured y_offset of the wafer This is basically a standard FFT transform, in which only 1 frequency component is calculated. Hence, there is only one for-next loop in the algorithm and not two nested for-next loops as appear in standard FFT transforms.

Furthermore, a geometrical arrangement of a number of sensors 4 around the substrate can be used to obtain a geometrical filtering of lower orders of unroundness. A limited number of stationary sensors can be used, the angular position of which is determined as follows:

In determining the values for $x_{offset}$ and $y_{offset}$, the disturbance factor $$\sum_{m=2}^{\infty} A_m \cos(m \cdot \varphi_{loadlock} + \varphi_{offset,wafer}(m))$$

may be minimized by proper choice of the detector positions with respect to the substrate.

Summing the disturbance term over all measuring points n, gives disturbance $$(\varphi_{n,loadlock}) \approx \sum_{n=1}^{N} \sum_{m=2}^{\infty} A_m \cos(m \cdot \varphi_{loadlock} + \varphi_{offset,wafer}(m))$$

Writing out the last term gives:

$$\text{disturbance}(\varphi_{n,loadlock}) \approx \sum_{n=1}^{N} \begin{pmatrix} A_2 \cos(2 \cdot \varphi_{n,loadlock} + \varphi_{offset,wafer}(2)) \\ A_3 \cos(3 \cdot \varphi_{n,loadlock} + \varphi_{offset,wafer}(3)) \\ A_4 \cos(4 \cdot \varphi_{n,loadlock} + \varphi_{offset,wafer}(3)) \\ \text{etc.} \end{pmatrix}$$

Figure 8:
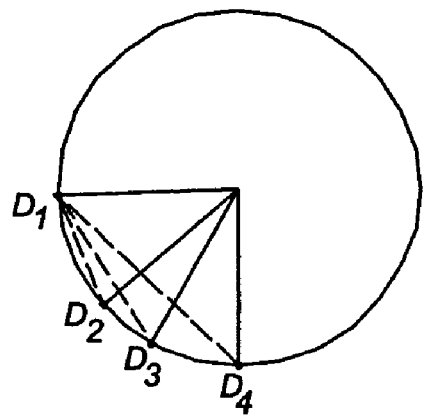
FIG. 8 shows a first array of detectors D1-D4 around the substrate position for detecting the wafer offset and/or higher order edge defects.

In order to minimize this fiction, all terms should be minimized independently (on the assumption that the terms are independent). In order to minimize the first term, two measuring points with a 90° phase shift are required. These detector positions are indicated at D1 and D4 in FIG. 8. In FIG. 8, the equidistant detector positions D1-D4 are given relative to the load lock, for m=2, 3 and 4.

The second term is minimized by two measuring points with a 60° phase shift. These detector positions are indicated by D1 and D3 in FIG. 8.

The third term is minimized by two measuring points with a 45° phase shift, detector positions D1 and D2 in FIG. 8. The next measuring points have phase shifts of 36°, 30° etc.

In case a notch is present on the substrate edge, the notch may coincide with one of the measuring points D1-D4. Therefore, two measuring points or detectors D5 and D6 are added such that, each time, two detector combinations are possible for a given phase shift, such as detectors D1, D4 and D3, D6 for a 90° phase shift. This is illustrated in FIG. 9.

Figure 9:
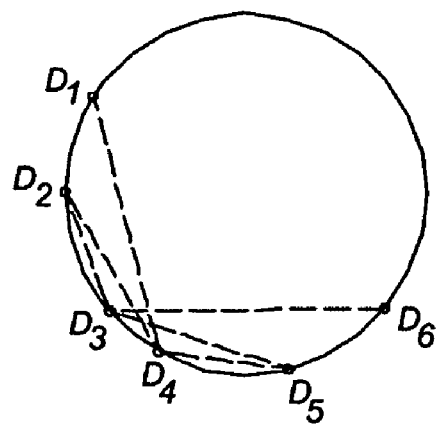
FIG. 9 shows a second array of detectors D1-D6 around the substrate position for detecting the substrate offset and/or higher order edge defects to be insensitive to the presence of a notch in the substrate edge.

The detector arrangement of FIG. 9 may be insensitive to the following aberrations in the substrate diameter: Elliptical, three-point, four lobes and six lobes aberrations of unroundness. Remaining aberrations have an order of 5, 7, 8, 9, 10 etc. (an angle of 30° being included twice).

It is noted that the pre-alignment procedure as illustrated in relation with FIG. 6 may have the advantage of an easy calibration of the sensor 5. For example, by rotating a substrate at the pre-processing position 16 and by comparing the measurement result of sensor 9 with that of sensor 5 a calibration may be performed. Herewith, it can be accomplished to perform a calibration without the necessity of using specific additional calibration tools inside the vacuum area.

Although specific reference may be made in this text to the use of the apparatus according to embodiments of the invention in the manufacture of ICs, it should be explicitly understood that such an apparatus has many other possible applications. For example, it may be employed in the manufacture of integrated optical systems, guidance and detection patterns for magnetic domain memories, liquidcrystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

While specific embodiments of the invention have been described above, it will be appreciated that the invention may be practiced otherwise than as described. The description is not intended to limit the invention.

What is claimed is:

1. A method of placing a substrate on a support member, the method comprising:
    (a) determining a position of the substrate relative to a reference position of the support member via a sensor which outputs a sensor signal to a control unit, said determining including;
        (i) detecting the position of the substrate in a chamber, and
        (ii) calculating a gripping position on the substrate;
    (b) gripping the substrate at said gripping position with a gripper controlled by the control unit, and
    (c) providing the substrate to a defined position on the support member using the gripper, said providing including moving the substrate using the gripper from the detected position of the substrate in the chamber to a fixed position relative to the support member such that the center of the substrate arrives at a predetermined position on the support member.

2. A method of placing a substrate on a support member, the method comprising:
    determining a position of the substrate located in a chamber relative to a reference position of the support member via a sensor which outputs a sensor signal to a control unit;
    gripping the substrate using a gripper at a fixed gripping position relative to the chamber;
    detecting the position of the gripped substrate using the sensor; and
    moving the substrate from the determined position of the substrate in the chamber to a varying position relative to the support member with the gripper such that the center of the substrate arrives at a predetermined position on the support member.

3. The method of claim 1, wherein the chamber is a reduced pressure transfer device, the method further comprising placing the substrate in the transfer device and evacuating the transfer device.

4. The method of claim 1, wherein the support member comprises a rotatable support surface having an axis of rotation substantially perpendicular to the support surface, the substrate being placed with its center at or near the rotation axis.

5. The method of claim 4, further comprising:
    rotating the support surface of the support member with the substrate thereon and detecting a number of edge positions of the substrate with a sensor,
    capturing the substrate from the support member using the gripper and
    returning the substrate with its center and its angular orientation in a defined position on the support member.

6. The method of claim 3, wherein the sensor is arranged in the transfer device.

7. The method of claim 3, wherein the sensor is arranged between the transfer device and the support member, the method further comprising moving the substrate relative to the sensor, calculating on the basis of a sensor signal from the sensor a position of the substrate, and directing the gripper to the fixed position.

8. The method of claim 2, wherein the sensor is arranged between the transfer device and the support member, the method further comprising moving the substrate relative to the sensor, calculating on the basis of a sensor signal from the sensor a position of the substrate, and directing the gripper to the varying position.

9. The method according to claim 4, wherein the sensor is arranged at or near the support member, the method further comprising calculating on the basis of a sensor signal from the sensor a position of the substrate and directing the gripper such that the center of the substrate is located at or near the rotation axis.

10. The method of claim 5, further comprising calculating the substrate edge positions $R(\phi)$ at different angles $\phi$ with respect to the support member in support member coordinates and determining a frequency component of the calculated edge position, the absolute value and phase of which representing an offset of a substrate coordinate center from a support member coordinate center.

11. The method of claim 10, wherein three detectors are distributed around the substrate at angular intervals of substantially 90°, 60° and 45° from a first detector.

12. The method of claim 1, wherein the sensor is a video camera, a signal of which being used in the control unit as a feedback signal for motion control of the gripper.

13. A device manufacturing method comprising:
    (1) projecting a patterned beam of radiation onto a target portion of a layer of radiation-sensitive material disposed on a substrate, and
    (2) positioning the substrate on a support member, said positioning including:
        (a) determining a position of the substrate relative to a reference position of the support member via a sensor which outputs a sensor signal to a control unit, said determining including:
            (i) detecting the position of the substrate in a chamber, and
            (ii) calculating a gripping position on the substrate;
        (b) gripping the substrate at said gripping position with a gripper controlled by the control unit, and
        (c) providing the substrate to a defined position on the support member using the gripper, said providing including moving the substrate using the gripper from the detected position of the substrate in the chamber to a fixed position relative to the support member such that the center of the substrate arrives at a predetermined position on the support member.

14. The method according to claim 13, wherein the projection beam includes EUV radiation.

15. A substrate handler comprising:
    a chamber including a substrate support member configured to receive a substrate thereon;
    a transfer device configured to transfer the substrate from a first atmosphere into the chamber;

a sensor configured to determine the position of the substrate relative to a reference position of the substrate support member;

a control unit connected to the sensor;

a gripper arranged in the chamber and configured to capture the substrate in the transfer device and to transfer the substrate to the support member, the gripper being controlled by the control unit;

wherein the sensor is adapted to detect the position of the substrate relative to the chamber, and wherein the control unit is configured to determine a gripping position on the substrate and to control the gripper to (1) capture the substrate at the gripping position and (2) move the substrate from the transfer device to a fixed position relative to the support member such that the center of the substrate is positioned at a predetermined position on the support member.

16. A substrate handler comprising:

a chamber including a substrate support member configured to receive a substrate thereon;

a transfer device configured to transfer the substrate from a first atmosphere into the chamber;

a sensor configured to determine the position of the substrate relative to a reference position of the substrate support member;

a control unit connected to the sensor, and a gripper arranged in the chamber and configured to capture the substrate in the transfer device and to transfer the substrate to the support member, the gripper being controlled by the control unit, wherein the control unit is adapted to control the gripper to (1) grip the substrate at a fixed gripping position relative to the chamber and (2) move the substrate from the transfer device to a varying position relative to the support member such that the center of the substrate arrives at a predetermined position on the support member, and wherein the sensor is adapted to detect the position of the gripped substrate.

17. The substrate handler of claim 15, wherein the chamber comprises a chamber of reduced pressure and the transfer device comprises a load lock device configured to sustain a reduced pressure therein.

18. The substrate handler of claim 15, wherein the support member comprises a rotatable support surface having an axis of rotation substantially perpendicular to the surface, the substrate being placeable with its center at or near the rotation axis by the gripper.

19. The substrate handler of claim 15, wherein the sensor is provided in the transfer device.

20. The substrate handler of claim 15, wherein the sensor is provided between the transfer device and the support member.

21. The substrate handler of claim 18, wherein the sensor is provided at or near the support member and the control unit is adapted to calculate on the basis of a sensor signal from the sensor a position of the substrate to direct the gripper such that the center of the substrate is located at or near the rotation axis.

22. The substrate handler of claim 18, comprising at least three detectors distributed around the substrate at angular intervals of substantially 90°, 60° and 45° from a first detector, wherein the control unit calculates substrate edge positions $R(\phi)$ at different angles $\phi$ with respect to the support member in support member coordinates and determining a frequency component of the calculated edge position, the absolute value and phase of which representing an offset of a substrate coordinate center from a support member coordinate center.

23. A lithographic projection apparatus comprising:

(a) a radiation system configured to condition a beam of radiation;

(b) a support structure configured to support a patterning device, the patterning device serving to pattern the beam of radiation according to a desired pattern;

(c) a projection system configured to project the patterned beam of radiation onto a target of the substrate, and (d) a substrate handler comprising:

(i) a chamber including a substrate support member configured to receive the substrate thereon;

(ii) a transfer device configured to transfer the substrate from a first atmosphere into the chamber;

(iii) a sensor configured to determine the position of the substrate relative to a reference position of the substrate support member;

(iv) a control unit connected to the sensor; and (v) a gripper arranged in the chamber and configured to capture the substrate in the transfer device and to transfer the substrate to the support member, the gripper being controlled by the control unit;

wherein the sensor is adapted to detect the position of the substrate relative to the chamber, and wherein the control unit is configured to determine a gripping position on the substrate and to control the gripper to (1) capture the substrate at the gripping position and (2) move the substrate from the transfer device to a fixed position relative to the support member such that the center of the substrate is positioned at a predetermined position on the support member.

* * * * *